United States Patent
Lin et al.

(10) Patent No.: US 8,344,447 B2
(45) Date of Patent: Jan. 1, 2013

(54) SILICON LAYER FOR STOPPING DISLOCATION PROPAGATION

(75) Inventors: Hsien-Hsin Lin, Hsin-Chu (TW); Weng Chang, Hsin-Chu (TW); Chien-Chang Su, Kaohsiung (TW); Kuan-Yu Chen, Taipei (TW); Hsueh-Chang Sung, Jhubei (TW); Ming-Hua Yu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 394 days.

(21) Appl. No.: 11/732,889

(22) Filed: Apr. 5, 2007

(65) Prior Publication Data

US 2008/0246057 A1    Oct. 9, 2008

(51) Int. Cl.
*H01L 29/94* (2006.01)
(52) U.S. Cl. .................. 257/327; 257/66; 257/393
(58) Field of Classification Search .......... 257/393, 257/49, 66, 327
See application file for complete search history.

(56) References Cited

U.S. PATENT DOCUMENTS

| | | | | |
|---|---|---|---|---|
| 6,339,232 | B1 * | 1/2002 | Takagi | 257/192 |
| 6,891,192 | B2 * | 5/2005 | Chen et al. | 257/49 |
| 7,105,393 | B2 | 9/2006 | Yao et al. | |
| 7,534,689 | B2 * | 5/2009 | Pal et al. | 438/300 |
| 7,696,019 | B2 * | 4/2010 | Han | 438/149 |
| 2001/0003364 | A1 | 6/2001 | Sugawara et al. | |
| 2007/0026599 | A1 * | 2/2007 | Peidous et al. | 438/199 |
| 2007/0235802 | A1 * | 10/2007 | Chong et al. | 257/346 |
| 2008/0054347 | A1 * | 3/2008 | Wang | 257/327 |

FOREIGN PATENT DOCUMENTS

| | | |
|---|---|---|
| CN | 1482651 A | 3/2004 |
| CN | 1830092 A | 9/2006 |

* cited by examiner

*Primary Examiner* — Howard Weiss
*Assistant Examiner* — Tifney Skyles
(74) *Attorney, Agent, or Firm* — Slater & Matsil, L.L.P.

(57) ABSTRACT

A composite semiconductor structure and method of forming the same are provided. The composite semiconductor structure includes a first silicon-containing compound layer comprising an element selected from the group consisting essentially of germanium and carbon; a silicon layer on the first silicon-containing compound layer, wherein the silicon layer comprises substantially pure silicon; and a second silicon-containing compound layer comprising the element on the silicon layer. The first and the second silicon-containing compound layers have substantially lower silicon concentrations than the silicon layer. The composite semiconductor structure may be formed as source/drain regions of metal-oxide-semiconductor (MOS) devices.

11 Claims, 5 Drawing Sheets

SILICON LAYER FOR STOPPING DISLOCATION PROPAGATION

TECHNICAL FIELD

This invention relates generally to integrated circuits, and more particularly to structures and formation methods of metal-oxide-semiconductor (MOS) devices having stressors.

BACKGROUND

Reductions in the size and inherent features of semiconductor devices (e.g., metal-oxide-semiconductor (MOS) devices) have enabled continued improvements in speed, performance, density, and cost per unit function of integrated circuits over the past few decades. In accordance with a design of the transistor and one of the inherent characteristics thereof, modulating the length of a channel region underlying a gate between a source and a drain of a MOS device alters a resistance associated with the channel region, thereby affecting the performance of the transistor. More specifically, shortening the length of the channel region reduces a source-to-drain resistance of the transistor, which, assuming all other parameters are maintained relatively constant, may allow an increase in current flow between the source and the drain when a sufficient voltage is applied to the gate of the transistor.

To further enhance the performance of MOS devices, stress may be introduced into the channel region of a MOS device to improve its carrier mobility. Generally, it is desirable to induce a tensile stress in the channel region of an n-type MOS (NMOS) device in a source-to-drain direction and to induce a compressive stress in the channel region of a p-type MOS (PMOS) device in a source-to-drain direction.

A commonly used method for applying compressive stresses to the channel regions of PMOS devices is to grow SiGe stressors in source and drain regions. Such a method typically includes the steps of forming a gate stack on a semiconductor substrate; forming spacers on sidewalls of the gate stack; forming recesses in the silicon substrate along the gate spacers; epitaxially growing SiGe stressors in the recesses; and then annealing. SiGe stressors apply a compressive stress to the channel region, which is located between a source SiGe stressor and a drain SiGe stressor. Similarly, for NMOS devices, stressors that may introduce tensile stresses, such as SiC stressors, may be formed.

The conventional stressor formation processes suffer drawbacks, however. Although the epitaxially grown SiGe stressors have the ability of applying high stresses to the channel regions, the subsequent source/drain implantation of impurities adversely causes the relaxation of the stresses. It has been found that after the subsequent implantation and the rapid thermal annealing, the channel stress may be reduced from about 1.7 GPa to about 0.9 GPa, or even less. Even worse, the relaxation of the stresses is more significant in SiGe stressors having high stresses, which are incurred by a high concentration of germanium.

An additional problem lies in the increase of leakage currents. During the impurity implantation, silicon and germanium atoms are dislocated from lattice locations. The subsequent rapid thermal anneal causes the propagation of the dislocations toward source/drain junctions, and hence higher leakage currents.

Accordingly, what is needed in the art are MOS devices that incorporate stressors thereof to take advantage of the benefits associated with increased channel stresses while at the same time overcoming the deficiencies of the prior art.

SUMMARY OF THE INVENTION

In accordance with one aspect of the present invention, a semiconductor structure includes a first silicon-containing compound layer comprising an element selected from the group consisting essentially of germanium and carbon; a silicon layer on the first silicon-containing compound layer, wherein the silicon layer comprises substantially pure silicon; and a second silicon-containing compound layer comprising the element on the silicon layer. The first and the second silicon-containing compound layers have substantially lower silicon concentrations than the silicon layer.

In accordance with another aspect of the present invention, a semiconductor structure includes a semiconductor substrate; a gate stack on the semiconductor substrate; and a source/drain region having at least a portion in the semiconductor substrate and adjacent the gate stack. The source/drain region includes a first stressor region comprising an element selected from the group consisting essentially of germanium and carbon; and a silicon region comprising substantially pure silicon over the first stressor region. The first stressor region has a substantially lower silicon concentration than the silicon region. The semiconductor structure further includes a doped region extending from a top surface of the first stressor region into the first stressor region. The doped region has a substantially greater impurity concentration than remaining portions of the source/drain region. The doped region is substantially above a bottom surface of the silicon region.

In accordance with yet another aspect of the present invention, a metal-oxide-semiconductor (MOS) device includes a semiconductor substrate; a gate stack on the semiconductor substrate; and a source/drain stressor having at least a portion in the semiconductor substrate and adjacent the gate stack. The source/drain stressor includes a first SiGe region; a silicon region comprising substantially pure silicon over the first SiGe region; and a second SiGe region over the silicon region. The MOS device further includes a silicide region over the second SiGe region.

In accordance with yet another aspect of the present invention, a method of forming a semiconductor structure includes forming a first silicon-containing compound layer comprising an element selected from the group consisting essentially of germanium and carbon; forming a silicon layer on the first silicon-containing compound layer, wherein the silicon layer comprises substantially pure silicon; and forming a second silicon-containing compound layer comprising the element on the silicon layer, wherein the first and the second silicon-containing compound layers have substantially lower silicon concentrations than the silicon layer.

In accordance with yet another aspect of the present invention, a method of forming a semiconductor structure includes providing a semiconductor substrate; forming a gate stack on the semiconductor substrate; forming a recess in the semiconductor substrate, wherein the recess is adjacent to the gate stack; and forming a stressor having at least a portion in the recess. The step of forming the stressor includes epitaxially growing a first stressor region comprising a material selected from the group consisting essentially of SiGe and SiC; and epitaxially growing a silicon region comprising substantially pure silicon over the first stressor region. The method further includes implanting an impurity selected from the group consisting essentially of a p-type impurity and an n-type impurity into a region substantially over a bottom surface of the silicon region.

The advantageous features of the present invention include improved channel stress and reduced leakage currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for reducing dislocation propagation, and hence reducing stress relaxation, is provided. The intermediate stages of manufacturing preferred embodiments of the present invention are illustrated in FIGS. 1 through 7. Variations of the preferred embodiments are then discussed. Throughout the various views and illustrative embodiments of the present invention, like reference numbers are used to designate like elements.

Figure 1:
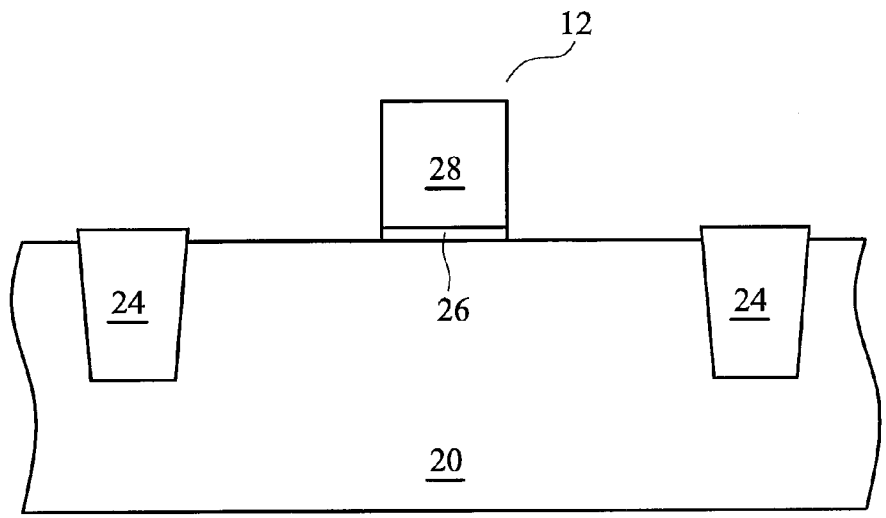
FIGS. 1 through 7 are cross-sectional views of intermediate stages in the manufacturing of an embodiment of the present invention, wherein a silicon layer is inserted into silicon germanium stressors.

Referring to FIG. 1, substrate 20 is provided. In an embodiment, substrate 20 is formed of bulk silicon. Alternatively, substrate 20 is formed of compounds of group III, group IV and/or group V elements. Substrate 20 may also have a composite structure such as silicon-on-insulator (SOI) structure. Shallow trench isolation (STI) regions 24 are formed in substrate 20 to isolate device regions. As is known in the art, STI regions 24 may be formed by etching substrate 20 to form recesses, and then filling the recesses with dielectric materials such as high-density plasma oxides.

Gate stack 12, which includes gate dielectric 26 and gate electrode 28, is formed on substrate 20. Gate dielectric 26 preferably has a high dielectric constant (k value), and may include commonly used dielectric materials such as oxides, nitrides, oxynitrides, and combinations thereof. Gate electrode 28 may include doped polysilicon, metals, metal silicides, metal nitrides, and combinations thereof. As is known in the art, gate dielectric 26 and gate electrode 28 are preferably formed by depositing a gate electrode layer on a gate dielectric layer, and then patterning the gate electrode layer and the gate dielectric layer.

Figure 2:
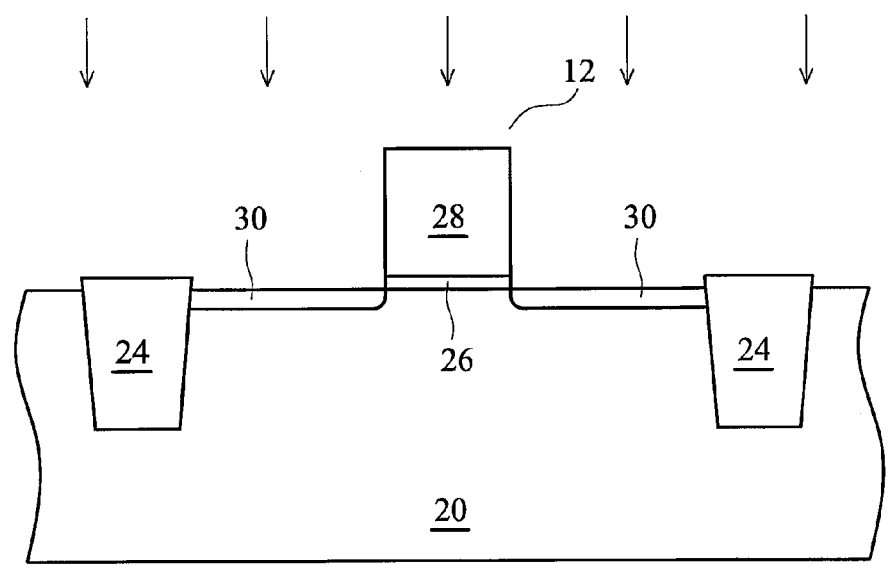

Lightly doped source/drain (LDD) regions 30 are then formed, preferably by implanting a p-type impurity, as is shown in FIG. 2. Gate stack 12 acts as a mask so that LDD regions 30 are substantially aligned with the edges of gate stack 12. Halo and/or pocket regions (not shown) may also be formed, preferably by implanting n-type impurities. Alternatively, LDD regions 30 are formed after the stressors are formed, as is discussed in detail in subsequent paragraphs.

Figure 3:
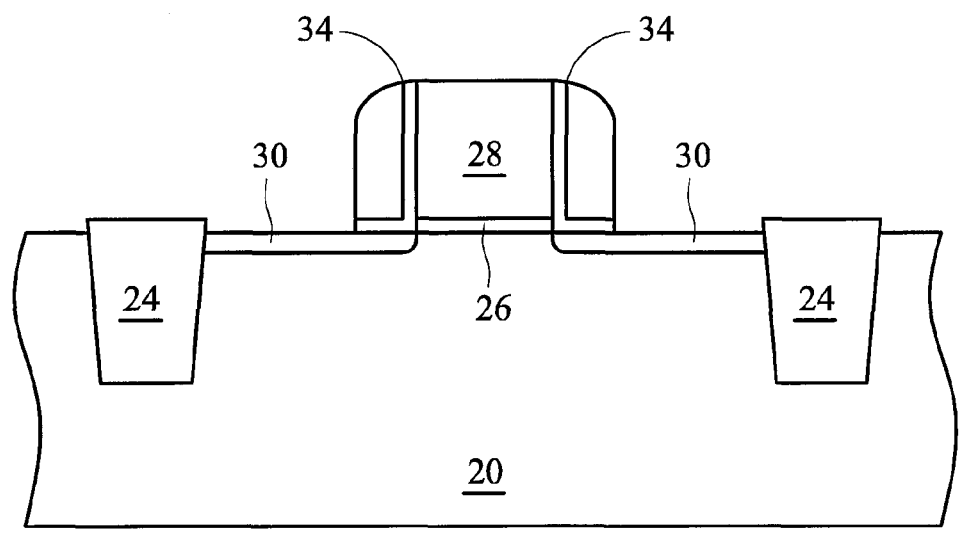

FIG. 3 illustrates the formation of gate spacers 34. As is known in the art, to form gate spacers 34, a gate spacer layer (not shown) is first formed. In an embodiment, the gate spacer layer includes a liner oxide layer and an overlying nitride layer. In alternative embodiments, the gate spacer layer may include a single layer or more than two layers, each comprising silicon oxide, silicon nitride, silicon oxynitride and/or other dielectric materials. The gate spacer layer may be formed using commonly used techniques, such as plasma enhanced chemical vapor deposition (PECVD), low-pressure chemical vapor deposition (LPCVD), sub-atmospheric chemical vapor deposition (SACVD), and the like.

The gate spacer layer is then patterned to form gate spacers 34, wherein the patterning may be performed by dry etching. Horizontal portions of the gate spacer layer are removed, and the remaining portions form gate spacers 34. In an exemplary embodiment, the resulting gate spacers 34 are preferably thin spacers with a thickness of between about 150 Å and about 300 Å.

Figure 4:
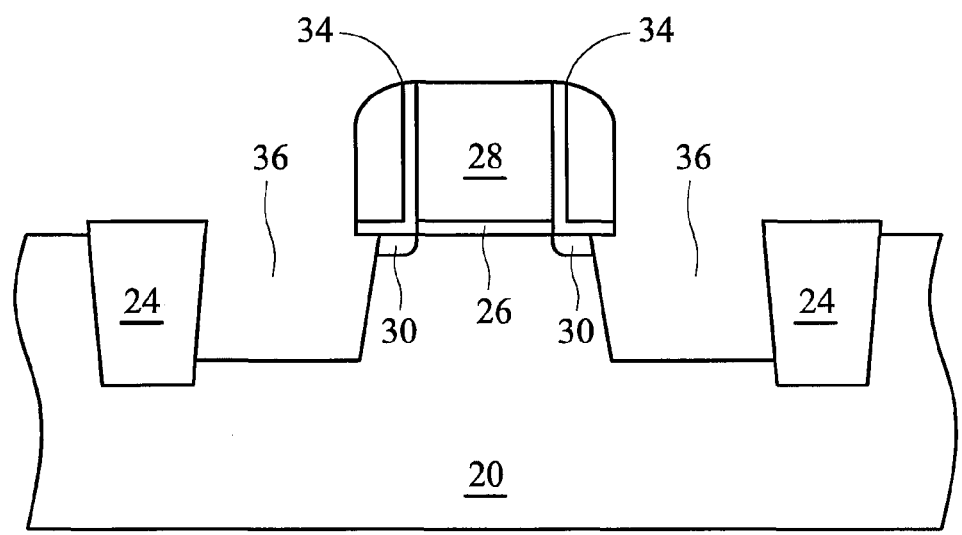

Referring to FIG. 4, recesses 36 are formed along the edges of gate spacers 34, preferably by etching isotropically or anisotropically. In 90 nm technology, the preferred depth of recesses 36 is between about 500 Å and about 1000 Å, and more preferably between about 600 Å and 900 Å. One skilled in the art will realize that the dimensions provided throughout the description are merely examples, and the preferred dimensions will change with the scaling of the technology used for forming the integrated circuits. If gate spacers 34 are dummy spacers that will be replaced by new, preferably wider, gate spacers in the subsequent processes, the etching is preferably isotropic, so that recesses 36 extend under gate spacers 34. Otherwise, the etching may be either anisotropic or isotropic.

Figure 5:
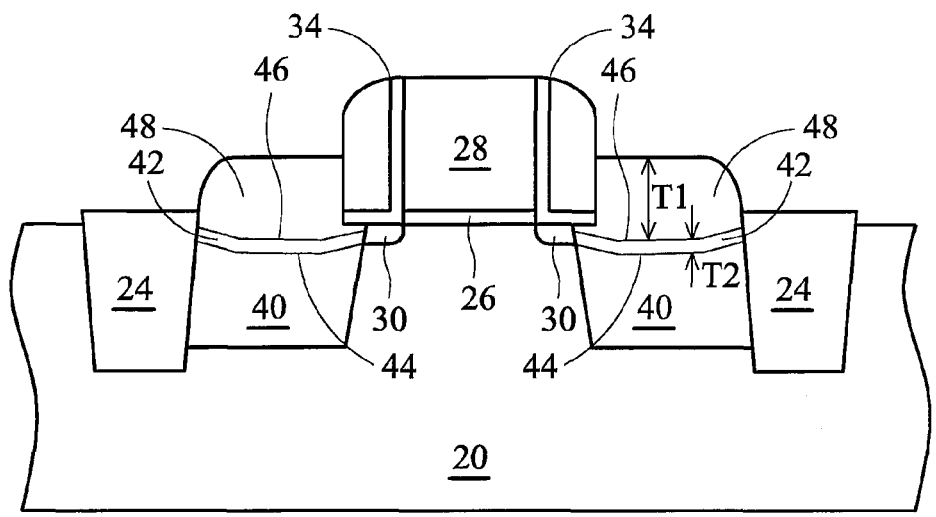

FIG. 5 illustrates the formation of epitaxy regions, often referred to as stressors. In an embodiment, the stressors are composite stressors having a sandwich structure, with three stacked layers 40, 42 and 48. In the epitaxial process, silicon germanium (SiGe) regions 40 are first epitaxially grown in recesses 36, preferably by selective epitaxial growth (SEG). SiGe regions 40 preferably have a lattice spacing greater than the lattice spacing of substrate 20. In an exemplary embodiment, SiGe regions 40 are formed in a chamber using chemical vapor deposition (CVD). The precursors include Si-containing gases and Ge-containing gases, such as $SiH_4$, dichlorosiliane (DCS), and $GeH_4$, respectively, and the partial pressures of the Si-containing gases and Ge-containing gases are adjusted accordingly to modify the atomic ratio of germanium to silicon. P-type impurities, such as boron, may be doped as the epitaxial growth of SiGe regions 40 proceeds (referred to as in-situ doping hereinafter).

In a first embodiment, SiGe regions 40 are graded, with the lower portions having a lower germanium atomic percentage than upper portions. The germanium atomic percentage may be gradually increased from bottom to top. In a second embodiment, SiGe regions 40 have a substantially uniform germanium atomic percentage from bottom to top. Preferably, the germanium atomic percentage in SiGe regions 40 is between about 15 percent and about 40 percent. The thickness of SiGe regions 40 may be between about 500 Å and about 800 Å. In an exemplary embodiment, the preferred thickness of SiGe regions is about 90% of the depth of recesses 36 (refer to FIG. 4).

Process conditions for the epitaxy process are then changed to form silicon regions 42 on SiGe regions 40. In the preferred embodiment, silicon regions 42 comprise substantially pure silicon, for example, with a silicon atomic percentage of greater than about 99 percent. P-type impurities, such as boron, may be optionally in-situ doped to a low impurity concentration. In an exemplary embodiment, the precursors for forming silicon regions 42 include $SiCl_2H_2$ and/or $SiH_4$, and the deposition is performed at a temperature of between about 650° and 800° C. In an exemplary embodiment, silicon regions 42 have a thickness of between about 10 Å and about 100 Å.

In a first embodiment, silicon regions 42 are selectively grown only in the recesses, wherein etching gases, for example, HCl, may be introduced into the epitaxial growth environment while the epitaxial growth proceeds. Alternatively, no etching gases are conducted for the epitaxial growth, and a thin layer of silicon may be undesirably grown outside of recesses 36. In this case, an etching may be performed to remove the undesirably grown silicon layer.

SiGe regions 48 are then formed on second silicon regions 42. Preferably, the germanium atomic percentage in SiGe regions 48 is lower than that in the SiGe regions 40. An advantageous feature of having a lower germanium atomic percentage in SiGe regions 48 is that it is easy to form silicides on SiGe regions with less germanium. In an exemplary embodiment, SiGe regions 48 have a germanium atomic percentage of between about 10 atomic percent and about 20 atomic percent. Thickness T1 of SiGe regions 48 is preferably greater than about 200 Å, and more preferably between about 200 Å and about 300 Å. Furthermore, thickness T1 is preferably greater than the depth of impurities introduced in subsequent deep source/drain implantation. The details are discussed in subsequent paragraphs.

P-type impurities, such as boron, are preferably in-situ doped in SiGe regions 48. In an exemplary embodiment, p-type impurities in SiGe regions 48 have a concentration of between about $1E19/cm^3$ and about $1E21/cm^3$.

Figure 6A:
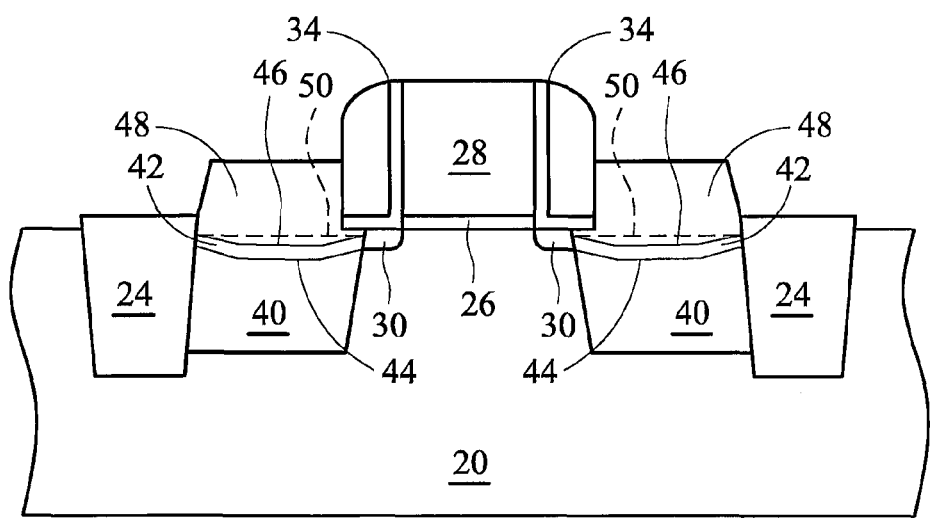

Next, as shown in FIG. 6A, an implantation is performed to dope p-type impurities. LDD regions 30, instead of formed before the formation of gate spacers 34, may be formed after the formation of regions 40, 42 and 48. The p-type impurities preferably include boron, indium, and the combinations thereof. The implanted impurities will destroy the lattice structure of at least top portions of the epitaxial regions, resulting in dislocations. Lines 50 schematically mark the positions of the end-of-range (EOR), which are where most of the implanted impurities stop at. Accordingly, regions above EOR lines 50 have higher impurity concentrations and higher dislocation concentrations than regions 40 and 42. Epitaxial regions 40, 42 and 48 substantially form the source/drain regions of the resulting MOS device.

In the preferred embodiment, EOR lines 50 (above which are doped regions as implanted) are above the bottom surfaces 44 of silicon regions 42. More preferably, EOR lines 50 are above the top surfaces 46 of silicon regions 42. To achieve this, the impurities and the respective implantation energies need to be tuned. In an exemplary embodiment, the energies for implanting boron ions are between about 2 keV and about 6 keV. If implanted with BF2, the energies for the implantation are preferably between about 10 keV and about 30 keV. Also, the thickness T1 of SiGe regions 48 and/or the thickness T2 of silicon regions 42 may be adjusted to ensure EOR lines 50 are above the surfaces 44 and/or 46 of silicon regions 42.

Figure 6B:
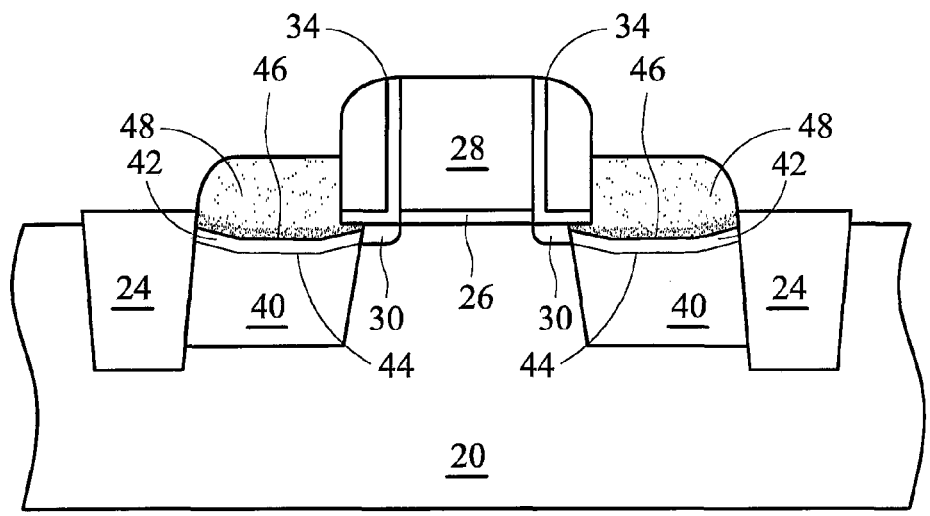

Please note that FIG. 6A only illustrates an intermediate structures, after the subsequent processes having elevated temperatures, the dislocations will propagate. However, due to the existence of silicon regions 42, only an insignificant portion of the dislocations may be propagated to below top surfaces 46 of silicon regions 42, and even fewer dislocations will be propagated to bottom surfaces 44 of silicon regions 42. FIG. 6B schematically illustrates the diffusion of the dislocations, wherein dots are used to symbolize the distribution of dislocations. Most of the dislocations are blocked by the top surfaces 46 and bottom surfaces 44 of silicon regions 42, and hence very few dislocations, if any at all, are located under silicon regions 42.

At the same time the dislocations propagate, the implanted impurity ions may also diffuse. The dots shown in FIG. 6B thus also schematically represent the distribution of the implanted ions after the diffusion. Again, even though some implanted ions may be diffused below silicon regions 42, a structural functional portion of the implanted ions will still stay above the silicon regions 42. Accordingly, it is still considered that the implanted ions are above silicon regions 42.

Figure 7:
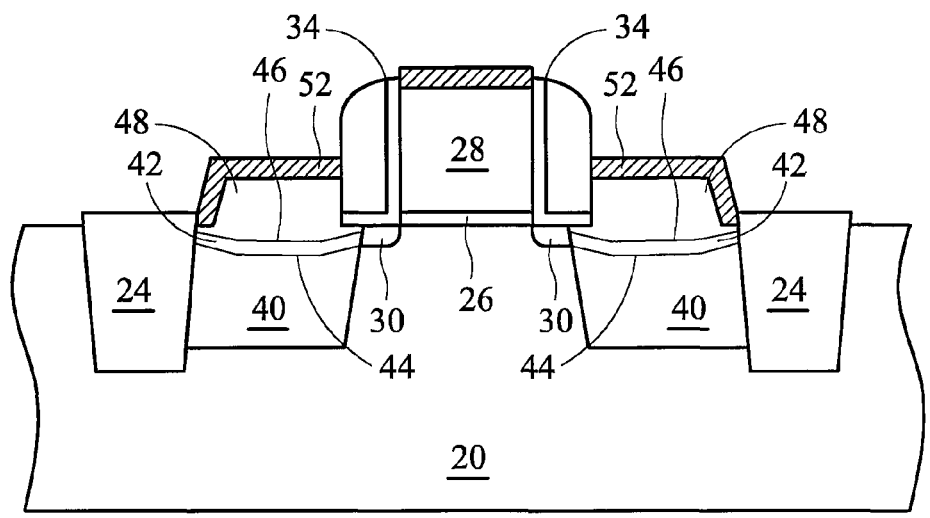

FIG. 7 illustrates the formation of germano-silicide regions 52. Throughout the description, germano-silicide regions 52 are also referred to as silicide regions 52. As is known in the art, silicide regions 52 are preferably formed by blanket depositing a thin layer of metal, such as nickel, platinum, cobalt, and combinations thereof. The substrate is then heated, which causes silicon and germanium to react with the metal where contacted. After the reaction, a layer of metal silicide and/or metal germano-silicide is formed between the silicon/germanium and the metal. The un-reacted metal is selectively removed through the use of an etchant that attacks metal but does not attack silicide and germano-silicide.

Figure 8:
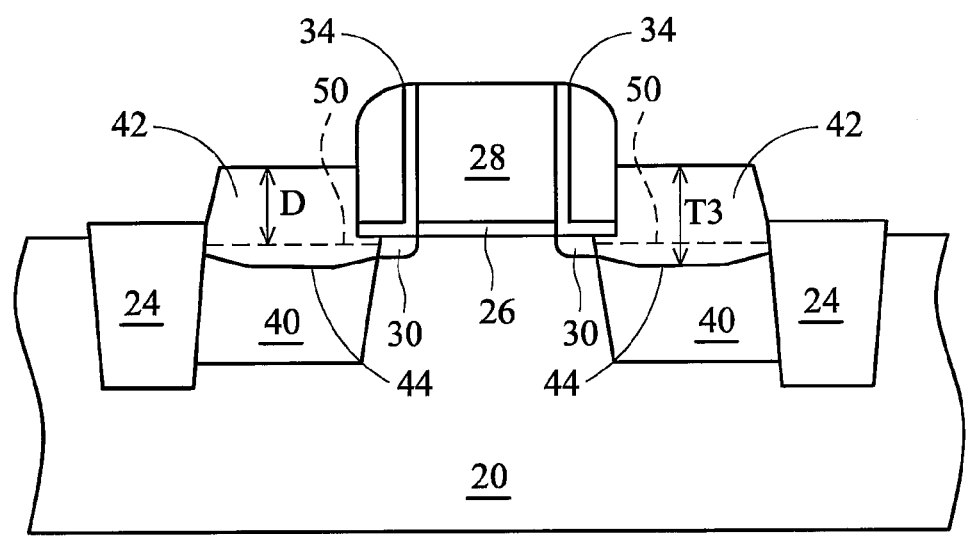
FIG. 8 illustrates an alternative embodiment, wherein a silicon layer is formed on top of a silicon germanium stressor.

FIG. 8 illustrates an alternative embodiment of the present invention. The initial stages are essentially the same as shown in FIGS. 1 through 4. Silicon regions 42, which have a substantially greater thickness T3 than thickness T2 in the first embodiment (refer to FIG. 5), are formed on SiGe regions 40. Preferably, thickness T3 is greater than the depth D of the EOR lines 50 of the subsequent source/drain implantation. In other words, the subsequently formed implantation regions are over bottom surfaces 44 of silicon regions 42. Accordingly, the dislocations generated by the source/drain implantation are substantially located above bottom surfaces 44 of silicon regions 42. In an exemplary embodiment, the thickness T3 of silicon regions 42 is preferably greater than about 200 Å, and more preferably between about 250 Å and about 300 Å. The preferred thickness T3 is also related to the energies and the species of the source/drain implantation, and greater thickness T3 is required if greater energies are used.

Please note that in the embodiment discussed in the preceding paragraphs, the thicknesses of regions 40, 42 and 48 all affect the resulting stress in the channel region, and the optimum thicknesses may be found through experiments. After the formation of silicon regions 42, silicide regions (not shown) are formed by siliciding top portions of silicon regions 42.

In the previously discussed embodiments, the epitaxial regions are formed without the help of dummy gate spacers. In alternative embodiments, after the formation of the epitaxial regions 40, 42 and 48, but before the source/drain implantation, gate spacers 34 are removed, and new gate spacers are formed. The new gate spacers are preferably wider than gate spacers 34. In this embodiment, the etching for forming recesses 36 (refer to FIG. 4) may be isotropic or anisotropic. LDD regions may be formed after the formation of regions 40, 42 and 48 and the removal of the dummy gate spacers.

Although the embodiments discussed in the preceding paragraphs uses SiGe stressor formed in PMOS devices as examples, one skilled in the art will realize that the concept of the present invention is readily available for the formation of NMOS devices. The NMOS devices may have a similar structure as illustrated in FIGS. 7 and 8, except that regions 40, 42 and 48 comprise SiC instead of SiGe, and n-type impurities such as phosphorus and/or arsenic replace p-type impurities. Preferably, the n-type impurities profile in SiC regions 40, 42 and 48 are essentially similar to the respective p-type impurities, as discussed in preceding paragraphs, although the carbon atomic percentage is typically lower than the germanium atomic percentage. For example, atomic percentages of carbon in SiC stressors are less than about 3 percent.

The embodiments of the present invention have several advantageous features. The stress relaxation is significantly reduced. Two samples have been made to reveal the effects of the present invention. The first sample includes SiGe regions having a thickness of about 900 Å. The second sample includes a composite layer including a 400 Å bottom SiGe layer, a 200 Å silicon layer and a 300 Å top SiGe layer. It has been found that after implanting boron and performing a rapid thermal anneal, the stress generated by a 900 Å SiGe layer is only about 0.77 GPa, while the stress generated by the composite layer is about 1.04 GPa. In addition, the leakage currents between source/drain regions and the silicon substrate are significantly reduced. Experiments have revealed that for a plurality of PMOS devices made using the embodiments of the present invention, the leakage currents are in the range lower than about 5E-12 amps. As a comparison, in the sample MOS devices including only a single SiGe layer in the stressors, the leakage currents are distributed between about 1E-11 amps and about 1E-9 amps. The mechanisms for such significant improvement are not fully understood. A possible explanation is that the silicon regions 42 form highly stressed interfaces 44 and 46 (refer to FIGS. 5 and 8) with the underlying SiGe regions 40 and overlying SiGe regions 48, respectively. When dislocation propagates downward during the subsequent anneals, the stressed surfaces 44 and 46 redirect the dislocations in the directions parallel to interfaces 44 and 46, preventing the dislocations from propagating downward and even reaching source/drain junctions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a metal-oxide-semiconductor (MOS) device comprising:
        a gate dielectric;
        a gate electrode over the gate dielectric;
        a first silicon-containing compound layer comprising an element selected from the group consisting essentially of germanium and carbon;
        a silicon layer on the first silicon-containing compound layer;
        a second silicon-containing compound layer comprising the element on the silicon layer, wherein the first and the second silicon-containing compound layers have substantially lower silicon concentrations than the silicon layer, wherein the element in the first silicon-containing compound layer has a first concentration higher than a second concentration of the element in the second silicon-containing compound layer, wherein the first silicon-containing compound layer, the silicon layer and the second silicon-containing compound layer are adjacent the gate dielectric, and wherein the first and the second silicon-containing compound layers do not extend into the region directly underlying the gate dielectric; and
    a silicide region over and contacting the second silicon-containing compound layer, wherein the silicide region is spaced apart from the first silicon-containing compound layer and the silicon layer by the second silicon-containing compound layer.

2. The semiconductor structure of claim 1, wherein the silicon layer comprises an impurity selected from the group consisting essentially of a p-type impurity and an n-type impurity.

3. The semiconductor structure of claim 1, wherein the silicon layer has a silicon concentration of greater than about 99 percent.

4. The semiconductor structure of claim 1, wherein the silicon layer and the first and the second silicon-containing compound layers form at least a portion of a source/drain region of the MOS device.

5. The semiconductor structure of claim 1, wherein the first silicon-containing compound layer, the silicon layer and the second silicon-containing compound layer comprise an impurity selected from the group consisting essentially of a p-type impurity and an n-type impurity, and wherein a concentration of the impurity in the second silicon-containing compound layer is higher than a concentration of the impurity in the first silicon-containing compound layer.

6. The semiconductor structure of claim 1, wherein the element is germanium, and wherein germanium atomic percentages in the first and the second silicon-containing compound layers are between about 10 percent and about 40 percent.

7. The semiconductor structure of claim 1, wherein the element is germanium, and wherein the MOS device is a p-type MOS device.

8. The semiconductor structure of claim 1, wherein the element is carbon, and wherein the MOS device is an n-type MOS device.

9. A metal-oxide-semiconductor (MOS) device comprising:
    a gate dielectric;
    a gate electrode over the gate dielectric;
    a first silicon-containing compound layer comprising an element selected from the group consisting essentially of germanium and carbon;
    a silicon layer disposed over, and not within, the first silicon-containing compound layer; and
    a second silicon-containing compound layer comprising the element over the silicon layer, wherein the first and the second silicon-containing compound layers have lower silicon concentrations than the silicon layer, wherein the first and the second silicon-containing compound layers have higher concentrations of the element than the silicon layer, wherein the first silicon-containing compound layer, the silicon layer, and the second silicon-containing compound layer are adjacent to the gate dielectric, and wherein the first and the second silicon-containing compound layers do not extend into the region directly underlying the gate dielectric.

10. The MOS device of claim 9, wherein the first silicon-containing compound layer and the silicon layer do not have top surfaces substantially level with each other.

11. The MOS device of claim 9, wherein the second silicon-containing compound layer is not within the silicon layer.

* * * * *